United States Patent
Kuo et al.

(10) Patent No.: US 7,697,295 B2
(45) Date of Patent: Apr. 13, 2010

(54) HEAT SINK CLIP

(75) Inventors: Jer-Haur Kuo, Taipei Hsien (TW);
Xin-Xiang Zha, Shenzhen (CN); Ye-Fei Yu, Shenzhen (CN); Lin Yang, Shenzhen (CN); Fang-Xiang Yu, Shenzhen (CN)

(73) Assignees: Fu Zhun Precision Insdustry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/256,463

(22) Filed: Oct. 22, 2008

(65) Prior Publication Data

US 2009/0268407 A1    Oct. 29, 2009

(30) Foreign Application Priority Data

Apr. 28, 2008    (CN) .................. 2008 1 0066695

(51) Int. Cl.
*H05K 7/20* (2006.01)
(52) U.S. Cl. ............... 361/709; 361/679.54; 361/704; 361/710; 165/80.3; 411/523; 24/296; 24/456; 248/505
(58) Field of Classification Search ........... 361/679.46, 361/679.54, 702–712, 715, 719; 257/706–727; 174/16.3, 252; 165/80.2, 80.3, 80.4, 80.5, 165/104.33, 185; 24/295, 296, 453–459, 24/625; 411/522, 523; 248/505, 510, 316.7, 248/500
See application file for complete search history.

(56) References Cited

U.S. PATENT DOCUMENTS

| | | | |
|---|---|---|---|
| 6,208,518 B1 * | 3/2001 | Lee | 361/704 |
| 6,456,493 B1 * | 9/2002 | Lee | 361/704 |
| 6,778,395 B1 * | 8/2004 | Dong et al. | 361/704 |
| 7,215,550 B1 * | 5/2007 | Yang et al. | 361/704 |
| 7,280,361 B1 * | 10/2007 | Lin | 361/704 |
| 7,292,442 B2 * | 11/2007 | Yu et al. | 361/704 |
| 7,375,965 B2 * | 5/2008 | Xia et al. | 361/704 |
| 7,391,615 B2 * | 6/2008 | Fu et al. | 361/704 |
| 7,409,751 B2 * | 8/2008 | Chen et al. | 24/455 |
| 7,409,752 B2 * | 8/2008 | Chen | 24/459 |
| 7,414,847 B2 * | 8/2008 | Xia et al. | 361/704 |
| 7,430,121 B2 * | 9/2008 | Lu et al. | 361/719 |
| 7,478,667 B2 * | 1/2009 | Yang | 165/80.2 |
| 7,564,689 B1 * | 7/2009 | Guo et al. | 361/704 |
| 7,576,987 B2 * | 8/2009 | Lai et al. | 361/704 |
| 7,604,041 B2 * | 10/2009 | Yu et al. | 165/80.3 |
| 2007/0139891 A1 | 6/2007 | Yu et al. | |

* cited by examiner

*Primary Examiner*—Michael V Datskovskiy
(74) *Attorney, Agent, or Firm*—Frank R. Niranjan

(57) ABSTRACT

A heat sink clip (30) includes an elongated resilient main body (31) with two spaced barbs (315) at a first end thereof, a first locking member (33) coupled with a second end of the main body and a moveable second locking member (32) movably coupled with the first end of the main body. The barbs each vertically extend and include a neck (3151) connecting with the main body and a locking end (3152) at a free end thereof. The moveable second locking member includes an operating portion (321) and a locking leg (322) defining two connecting slots (323) therein. Each of the connecting slots includes a longitudinally narrow portion (3231) and a longitudinally wide portion (3232) beside the narrow portion. The barbs enter the connecting slots through the wide portions and the necks are received in the narrow portions.

20 Claims, 5 Drawing Sheets

HEAT SINK CLIP

BACKGROUND

1. Field of the Disclosure

The disclosure generally relates to clips, and particularly to a clip used for securing a heat sink to an electronic component.

2. Description of Related Art

It is well-known that heat is generated by electronic components such as central processing units (CPUs) of computers. If the generated heat is not rapidly and efficiently removed, the electronic component may overheat and the performance thereof may be significantly degraded. Generally, a heat dissipation device such as a heat sink is attached to the electronic component for a cooling purpose.

In order to attach the heat sink to the electronic component, a fastening device such as a clip is generally required. For example, US Patent Application Publication No. 2007/0139891A1 discloses a heat sink clip used for securing a heat sink to a CPU which is mounted on a circuit board. The heat sink clip includes a spring member having an elongated main body, a second locking leg, an actuating member and an assisting member. A connecting portion is at one end of the main body and a first locking leg extends from the other end of the main body. The second locking leg is coupled to the connecting portion of the main body. The actuating member connects pivotally with the second locking leg. The assisting member is located between the actuating member and the connecting portion of the main body of the spring member. The actuating member forms a handle portion at one end thereof and a round rotating portion at the other end thereof. The rotating portion includes a plurality of teeth formed on a circumferential surface thereof. The assisting member includes a wedged main body and forms an inclined top surface at a top of the wedged main body. The assisting member further forms a plurality of teeth on the inclined top surface thereof for engaging the corresponding teeth of the actuating member. In operation, the actuating member is rotated to move the second locking leg from a released position to an abutting position, to impel the heat sink toward the CPU. The heat sink clip can be easily operated by hand, without requiring undue force. However, numerous components are required, and assembly is complex.

What is needed, therefore, is a heat sink clip for securing a heat sink to an electronic component which overcomes the described limitations.

SUMMARY

A heat sink clip includes an elongated resilient main body forming two spaced barbs at a first end thereof, a first locking member coupled with a second end of the main body and a moveable second locking member movably coupled with the first end of the main body. The barbs are each vertically extended and include a neck connecting with the main body and a locking end at a free end thereof. The moveable second locking member includes an operating portion and a locking leg defining two connecting slots therein. Each of the connecting slots includes a longitudinally narrow portion and a longitudinally wide portion therebeside. The barbs enter the connecting slots through the wide portions and the necks are received in the narrow portions.

Other advantages and novel features of the present invention will become more apparent from the following detailed description of embodiments when taken in conjunction with the accompanying drawings.

DETAILED DESCRIPTION

Figure 1:
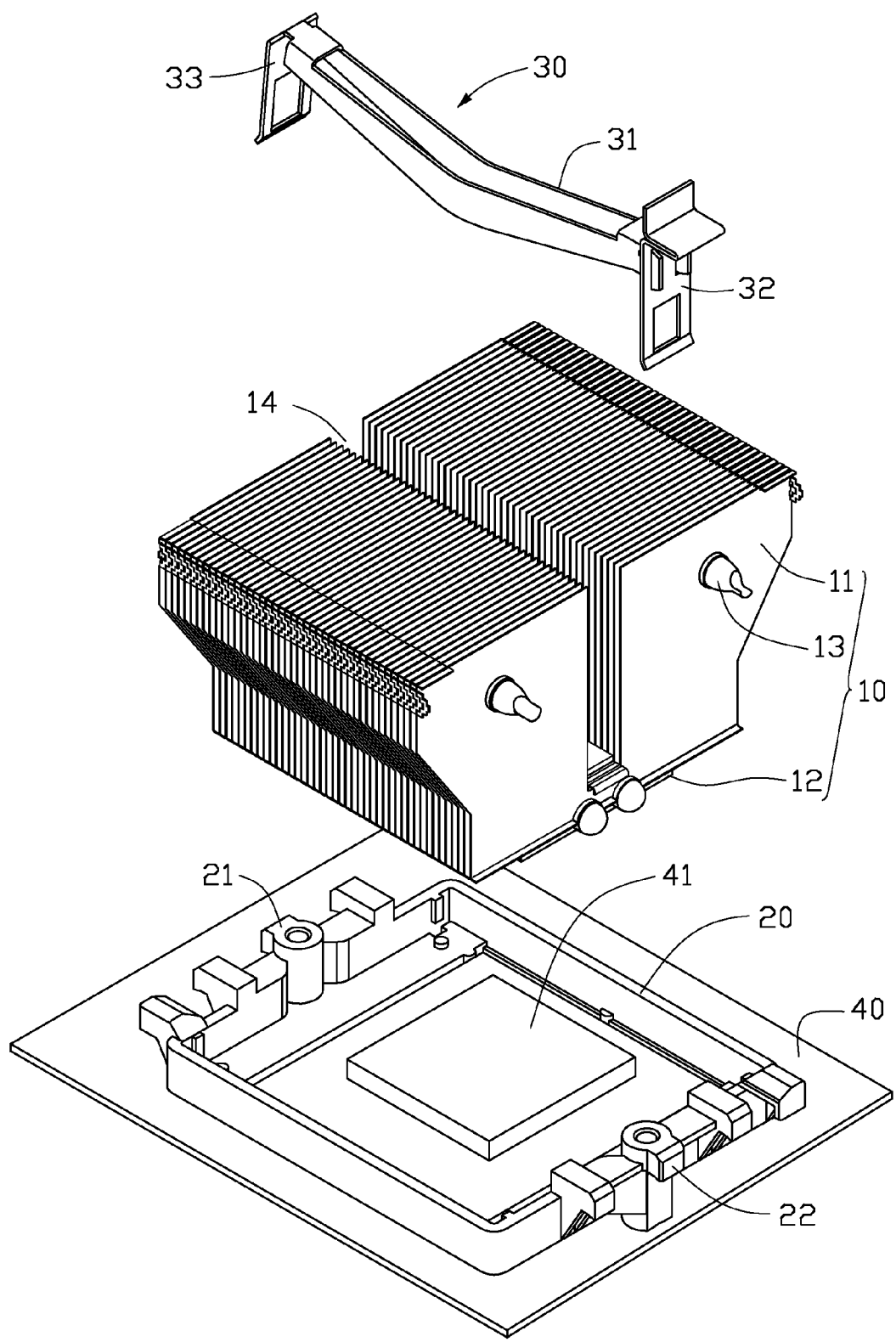
FIG. 1 is an exploded, isometric view of a heat dissipation apparatus in accordance with a first embodiment, together with a heat-generating electronic component mounted on a circuit board.
Figure 2:
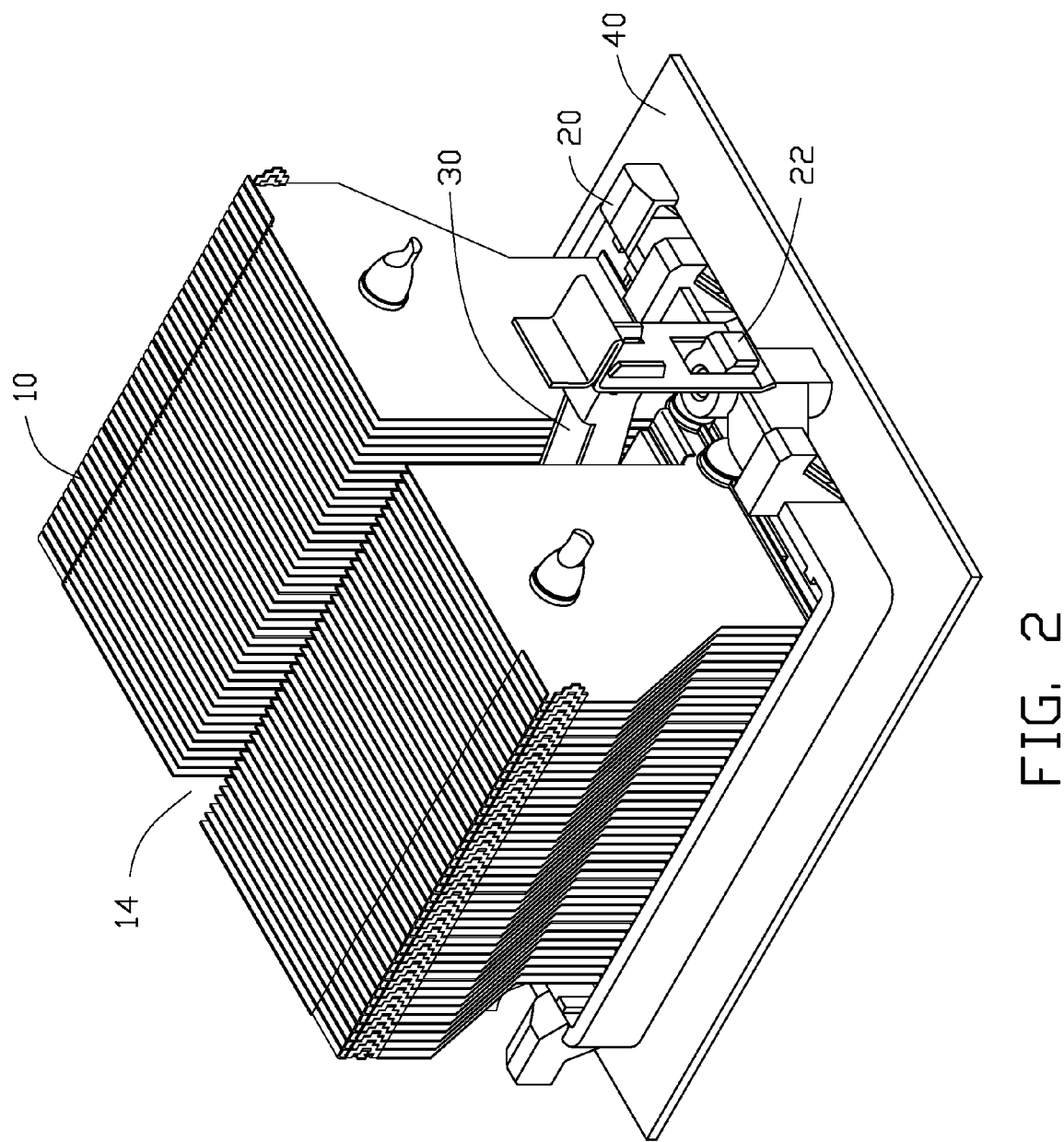
FIG. 2 shows the heat dissipation apparatus assembled to the electronic component on the PCB of FIG. 1.

Referring to FIGS. 1 and 2, a heat dissipation apparatus in accordance with a first embodiment is shown. The heat dissipation apparatus includes a heat sink 10, a retention frame 20, and a heat sink clip 30. The heat sink 10 is positioned on an electronic component 41 such as a central processing unit (CPU), mounted on a circuit board 40 and dissipating heat generated by the electronic component 41. The heat sink clip 30 secures the heat sink 10 to the electronic component 41.

The heat sink 10 includes a base 12 thermally contacting the electronic component 41, a fin assembly 11 mounted on the base 12, and a plurality of heat pipes 13 having one end embedded in the base 12 and an opposite end inserted in the fin assembly 11, transferring heat from the base 12 to the fin assembly 11. The fin assembly 11 of the heat sink 10 defines an elongated locating groove 14 through a middle portion thereof, receiving the heat sink clip 30 therein.

The electronic component 41 is surrounded by the retention frame 20 which is securely mounted on the PCB 40. The retention frame 20 is substantially rectangular. A first catch 21 and second catch 22 extend outwardly from the centers of two opposite sides of the retention frame 20, respectively.

Figure 3:
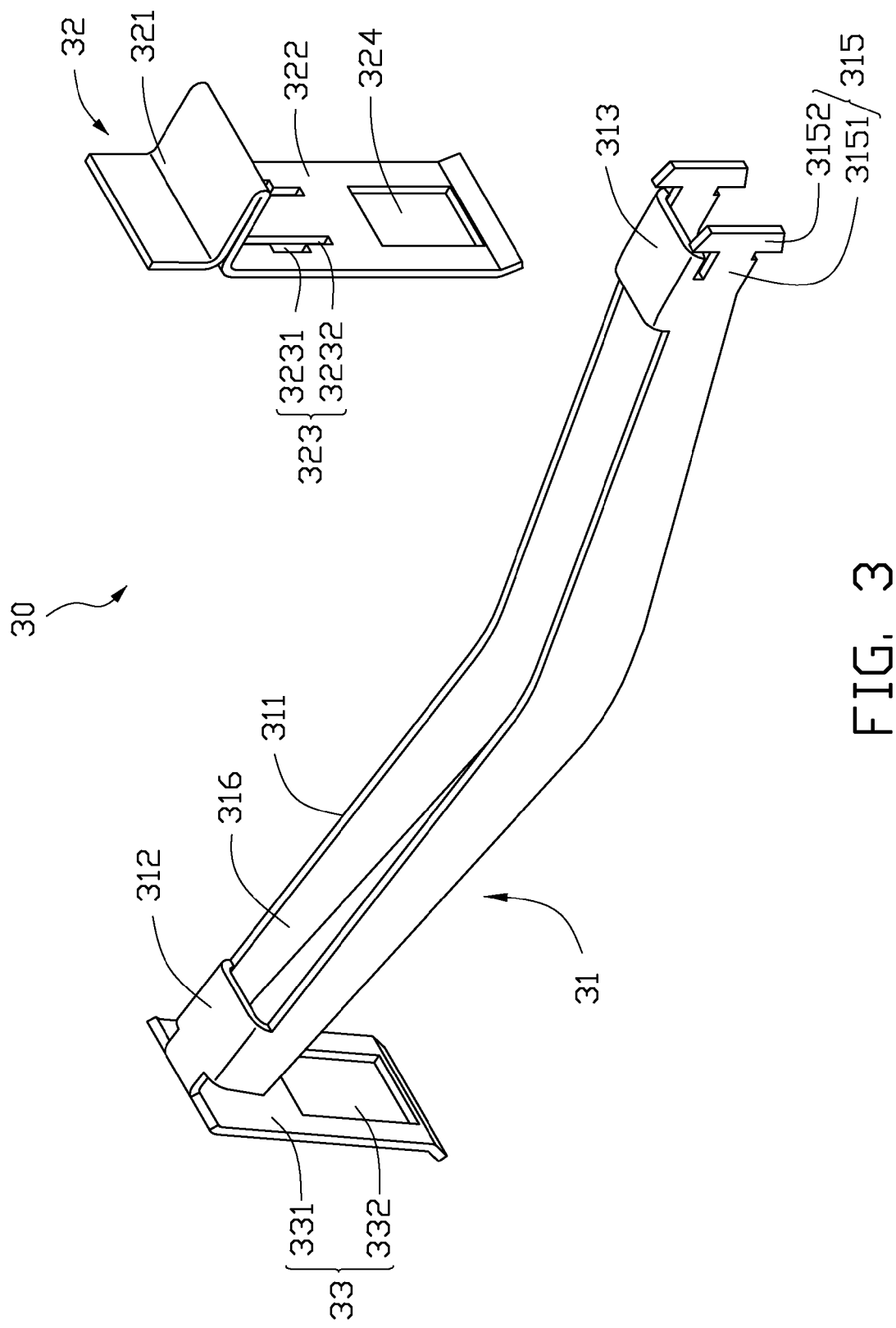
FIG. 3 is an exploded, isometric view of a heat sink clip of the heat dissipation apparatus of FIG. 1.

Referring to FIG. 3, the heat sink clip 30 includes an elongated resilient main body 31, a first locking member 33 and a moveable second locking member 32. The main body 31 defines an elongated cutout 316 therein, conserving material and increasing resilience. The main body 31 includes a flat first connecting plane 313, a flat second connecting plane 312, and two spaced elongated resilient arms 311 interconnecting the first and second connecting planes 313, 312. The first connecting plane 313 is at a right end of the main body 31 and the second connecting plane 312 is at an opposing left end of the main body 31. The resilient arms 311 are parallel substantially V-shaped sheets. The first locking member 33 includes a locking leg 331 integrally formed with and bent perpendicularly downward from the second connecting plane 312 of the main body 31. The locking leg 331 defines a first securing hole 332 adjacent to a bottom end thereof. The main body 31 integrally forms two T-shaped barbs 315 at the right end thereof. Each of the two barbs 315 extends rightward from a right end of one resilient arm 311. Each of the barbs 315 is perpendicular to the first connecting plane 313, and includes a neck 3151 connecting with the resilient arm 311 and a locking end 3152 at a free end of the barb 315. In a vertical orientation, top and bottom ends of the locking end 3152 extend beyond those of the neck 3151, respectively.

The moveable second locking member 32 is movably coupled with the right end of the main body 31. The moveable second locking member 32 includes an L-shaped operating portion 321 and a locking leg 322. The locking leg 322 is integrally formed with and extends downward from the operating portion 321. The locking leg 322 defines two T-shaped connecting slots 323 in a top portion thereof for engagingly receiving the barbs 315 of the main body 31. The two connecting slots 323 are located adjacent to two lateral sides of the locking leg 322, respectively. Each of the connecting slots 323 includes a longitudinally narrow portion 3231 and a longitudinally wide portion 3232 at an inner side of the narrow portion 3231. A distance between the narrow portions 3231 of the two connecting slots 323 does not exceed a distance between the two barbs 315. In a vertical direction, the wide portion 3232 is slightly wider than the locking end 3152, and the narrow portion 3231 of the connecting slot 333 is shorter than the locking end 3152 and longer than the neck 3151. The locking leg 322 defines a second securing hole 324 therein below the two connecting slots 323 engaging the second catch 22 of the retention frame 20.

In pre-assembly of the heat sink clip 30, the two barbs 315 are pressed inwardly toward each other so that a distance therebetween is reduced. When aligned with the wide portions 3232 of the two connecting slots 323 respectively, the barbs 315 are brought to extend into the wide portions 3232 of the T-shaped connecting slots 323. After the locking ends 3152 of the two barbs 315 pass fully through the wide portions 3232 of the T-shaped connecting slots 323, the necks 3151 of the two barbs 315 slide into the narrow portions 3231 of the two T-shaped connecting slots 323 respectively by release of the pressure force on the barbs 315. Thus the barbs 315 are restored to their original positions and engage the locking leg 322 of the moveable second locking member 32.

Referring back to FIGS. 1-2, in assembly, the heat sink 10 is placed on the electronic component 41. The resilient arms 311 of the main body 31 enter the locating groove 14 of the heat sink 10. The first securing hole 332 of the first locking member 33 loosely receives the first catch 21 of the retention frame 20. The operating portion 321 of the moveable second locking member 32 is pressed to move the locking leg 322 downwardly until the second lock hole 324 of the moveable second locking member 32 engages the second catch 22 of the retention frame 20. At the same time, the resilient arms 311 of the main body 31 exert downward force on the heat sink 10 whereby the heat sink 10 maintains intimate thermal contact with the heat-generating electronic component 41 to dissipate heat generated thereby. The first securing hole 332 of the first locking member 33 tightly engages the first catch 21 of the retention frame 20 by elastic restoring force of the resilient arms 311.

In the heat sink clip 30, the moveable second locking member 32 is coupled to the main body 31 via engagement between the barbs 315 of the main body 31 and connecting slots 323 of the moveable second locking member 32. Advantages of relatively few components and easy assembly are thus provided. Furthermore, the barbs 315 of the main body are vertically extended which increases the connecting strength of the main body 31 and the moveable second locking member 32.

Figure 4:
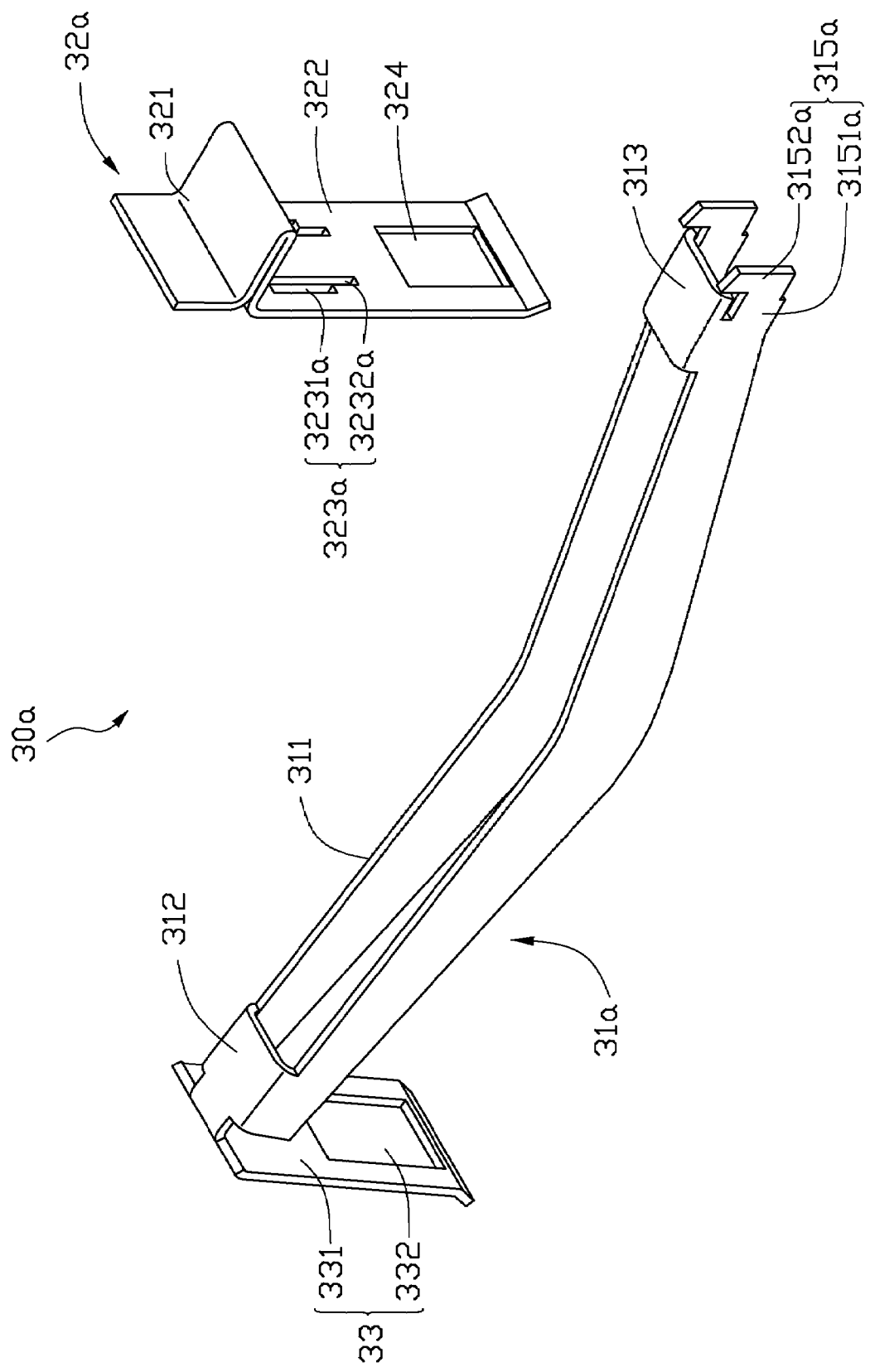
FIG. 4 is an exploded, isometric view of a heat sink clip in accordance with a second embodiment.

Referring to FIG. 4, a heat sink clip 30a according to a second embodiment is illustrated. The heat sink clip 30a includes an elongated main body 31a, a first locking member 33 and a moveable second locking member 32a. The first locking member 33 is integrally formed with and bent perpendicularly downward from the left end of the main body 31a. The moveable second locking member 32a is movably coupled with the right end of the main body 31a. The difference between the heat sink clip 30a and the heat sink clip 30 of FIG. 3 lies in that each of the barbs 315a of the main body 31a is L-shaped, including a neck 3151a connecting with the resilient arm 311 and a locking end 3152a at a free end of the barb 315a. In a vertical direction, a top end of the locking end 3152a extends beyond that of the neck 3151a. Each of the connecting slots 323a of the moveable second locking member 32a is substantially L-shaped, including a longitudinally wide portion 3232a through which the locking end 3152a of the barb 315a extends and a longitudinally narrow portion 3231a at an outer side of the wide portion 3232a receiving the neck 3151a of the barb 315a therein.

Figure 5:
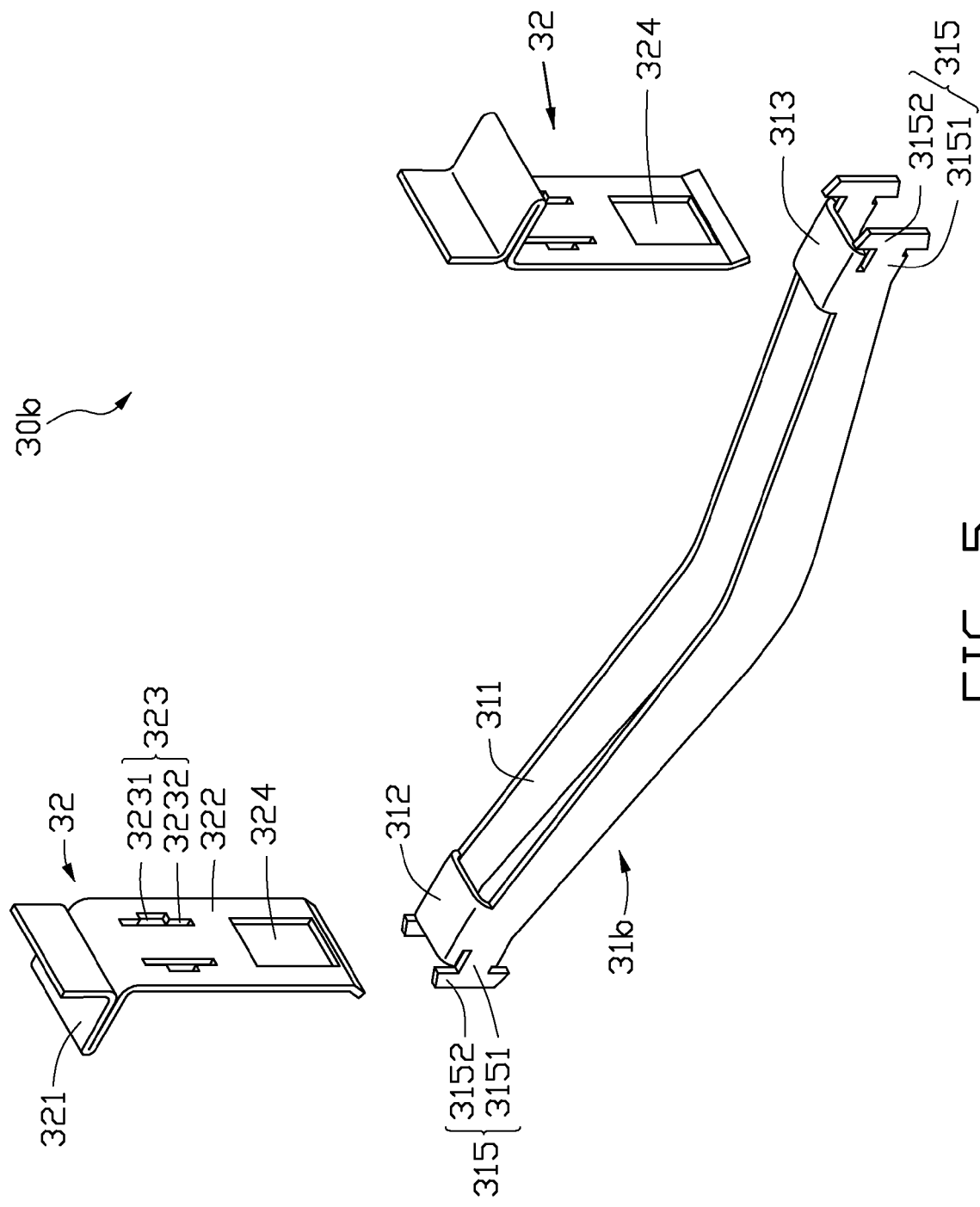
FIG. 5 is an exploded, isometric view of a heat sink clip in accordance with a third embodiment.

Referring to FIG. 5, a heat sink clip 30b according to a third embodiment is illustrated. The heat sink clip 30b includes an elongated main body 31b and a moveable second locking member 32 movably coupled with the right end of the main body 31b. The difference between heat sink clip 30b and heat sink clip 30 of FIG. 3 lies in an additional moveable second locking member 32 movably coupled with the left end of the main body 32, rather than the first locking member 33 of FIG. 3. The main body 31b integrally forms two T-shaped barbs 315 at the left end thereof for engaging the moveable second locking member 32. The first catch 21 of the retention frame 20 is received in the securing hole 324 defined in the locking leg 322 of the additional moveable second locking member 32. Alternatively, the barbs at two opposite ends of the main body can both be L-shaped, while the connecting slots defined in the two moveable second locking members are L-shaped.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip comprising:
an elongated resilient main body defining two spaced barbs at a first end thereof, the barbs each being vertically extended and comprising a neck connecting with the main body and a locking end at a free end of the barb;
a first locking member at an opposing second end of the main body; and
a moveable second locking member movably coupled with the first end of the main body, the moveable second locking member comprising an operating portion and a locking leg integrally extending downward from the operating portion, the locking leg defining two connecting slots therein for engagingly receiving the barbs of the main body; each of the connecting slots comprising a longitudinally narrow portion and a longitudinally wide portion beside the narrow portion, the barbs entering the connecting slots through the wide portions, and the necks of the barbs received in the narrow portions of the slots by which the moveable second locking member connects with the first end of the main body.

2. The heat sink clip of claim 1, wherein the main body comprises a flat first connecting plane at the first end thereof, a flat second connecting plane at the second end thereof, and two spaced elongated resilient arms interconnecting the first and second connecting planes, each of the barbs extending from an end of one resilient arm adjacent to the first connecting plane.

3. The heat sink clip of claim 2, wherein the resilient arms are parallel substantially V-shaped sheets.

4. The heat sink clip of claim 1, wherein in a vertical orientation, the narrow portion of the connecting slot is shorter than the locking end of the barb and longer than the neck of the barb.

5. The heat sink clip of claim 4, wherein a top end of the locking end is higher than that of the neck.

6. The heat sink clip of claim 4, wherein top and bottom ends of the locking end extend beyond those of the neck, respectively.

7. The heat sink clip of claim 1, wherein the first locking member is integrally formed with and bent downward from the second end of the main body.

8. The heat sink clip of claim 1, wherein the barbs of the main body and the connecting slots each are one of T-shaped and L-shaped.

9. The heat sink clip of claim 1, wherein the first locking member is movably coupled with the second end of the main body, the first locking member comprises an operating portion and a locking leg integrally extending downwardly from the operating portion, the locking leg of the first locking member defines two connecting slots therein, and the main body further defines two additional spaced barbs at the second end thereof engaging the connecting slots of the first locking member.

10. The heat sink clip of claim 1, wherein a distance between the narrow portions of the two connecting slots does not exceed a distance between the two barbs.

11. A heat dissipation apparatus comprising:
a retention frame configured for fixing to a circuit board on which a heat-generating electronic component is mounted, and surrounding the electronic component, the frame comprising first and second catches at two opposite sides thereof;
a head sink dissipating heat from the electronic component, defining an elongated locating groove through a middle portion thereof; and
a heat sink clip securing the heat sink onto the electronic component, comprising:
an elongated resilient main body received in the locating groove of the heat sink, the main body forming two spaced barbs at a first end thereof, the barbs each being vertically extended and comprising a neck connecting with the main body and a locking end at a free end of the barb;
a first locking member at a second end of the main body and engaging the first catch of the retention frame; and
a moveable second locking member movably coupled with the first end of the main body, comprising an operating portion and a locking leg integrally extending downward from the operating portion, the locking leg engaging the second catch of the retention frame and defining two connecting slots therein engagingly receiving the barbs of the main body, each of the connecting slots comprising a longitudinally narrow portion and a longitudinally wide portion therebeside, the barbs inserted into the connecting slots through the wide portions, and the necks of the barbs received in the narrow portions of the slots by which the moveable second locking member connects with the first end of the main body.

12. The heat dissipation apparatus of claim 11, wherein the main body comprises a flat first connecting plane at the first end thereof, a flat second connecting plane at the second end thereof, and two spaced elongated resilient arms interconnecting the first and second connecting planes, with each of the barbs extending from an end of one resilient arm adjacent to the first connecting plane.

13. The heat dissipation apparatus of claim 12, wherein the resilient arms are parallel substantially V-shaped sheets.

14. The heat dissipation apparatus of claim 11, wherein in a vertical orientation, the narrow portion of the connecting slot is shorter than the locking end of the barb and longer than the neck of the barb.

15. The heat dissipation apparatus of claim 11, wherein a top end of the locking end is higher than that of the neck.

16. The heat dissipation apparatus of claim 11, wherein the first locking member is integrally formed with and bent downward from the second end of the main body.

17. The heat dissipation apparatus of claim 11, wherein the barbs of the main body and the connecting slots each are one of T-shaped and L-shaped.

18. The heat dissipation apparatus of claim 11, wherein the first locking member is movably coupled with the second end of the main body, comprising an operating portion and a locking leg integrally extending downward therefrom, the locking leg of the first locking member defining two connecting slots therein, the main body further defining two additional spaced barbs at the second end thereof engaging the connecting slots of the first locking member.

19. The heat dissipation apparatus of claim 11, wherein a distance between the narrow portions of the two connecting slots does not exceed a distance between the two barbs.

20. The heat dissipation apparatus of claim 11, wherein the operating portion of the moveable second locking member is L-shaped.

* * * * *